(12) United States Patent
Nakayama et al.

(10) Patent No.: US 7,651,931 B2
(45) Date of Patent: Jan. 26, 2010

(54) LASER BEAM PROJECTION MASK, AND LASER BEAM MACHINING METHOD AND LASER BEAM MACHINE USING SAME

(75) Inventors: Junichiro Nakayama, Kyoto-fu (JP); Masanori Seki, Tenri (JP); Hiroshi Tsunasawa, Kyoto-fu (JP); Yoshihiro Taniguchi, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 954 days.

(21) Appl. No.: 11/158,528

(22) Filed: Jun. 21, 2005

(65) Prior Publication Data
US 2005/0287773 A1    Dec. 29, 2005

(30) Foreign Application Priority Data
Jun. 24, 2004   (JP) .......................... P2004-186525

(51) Int. Cl.
*H01L 21/20* (2006.01)
(52) U.S. Cl. ................. 438/487; 438/166; 438/401; 438/479; 438/486; 438/496; 257/E21.134
(58) Field of Classification Search .............. None
See application file for complete search history.

(56) References Cited

U.S. PATENT DOCUMENTS 5,426,640 A    6/1995   Hluchyj et al. ............. 370/94.1
5,710,620 A *  1/1998   Taniguchi ..................... 355/53
2003/0022471 A1* 1/2003 Taketomi et al. ........... 438/496
2004/0158765 A1  8/2004 Charzinski ..................... 714/4

FOREIGN PATENT DOCUMENTS

| JP | 2000-505241 | 4/2000 |
| JP | 2004-152232 | 5/2004 |
| WO | WO97/45827 | 12/1997 |
| WO | 0243331 | 5/2002 |
| WO | WO-03/043093 A1 | 5/2003 |

OTHER PUBLICATIONS

Junaid Ahmed Zubairi, "On Shaping and Handling VBR traffic in a Diffserv domain," Publications of Dr. Junaid Zubairi, 9 pages.

* cited by examiner

*Primary Examiner*—N Drew Richards
*Assistant Examiner*—Kyoung Lee
(74) *Attorney, Agent, or Firm*—Edwards Angell Palmer & Dodge LLP; David G. Conlin; Peter J. Manus

(57) ABSTRACT

The laser beam projection mask 14 has three rectangular-shaped slits 25, 26, 27 as transmission areas. These three slits 25, 26, 27 are formed in sequence in X direction shown by an arrow X in FIG. 2C at specified intervals, and the width in the X direction decreases in the order of the slit 25, the slit 26 and the slit 27. More particularly, transmission coefficients of the transmission areas change in conformity with a temperature distribution curve V1 of a silicon film 4 shown in FIG. 2B.

11 Claims, 13 Drawing Sheets

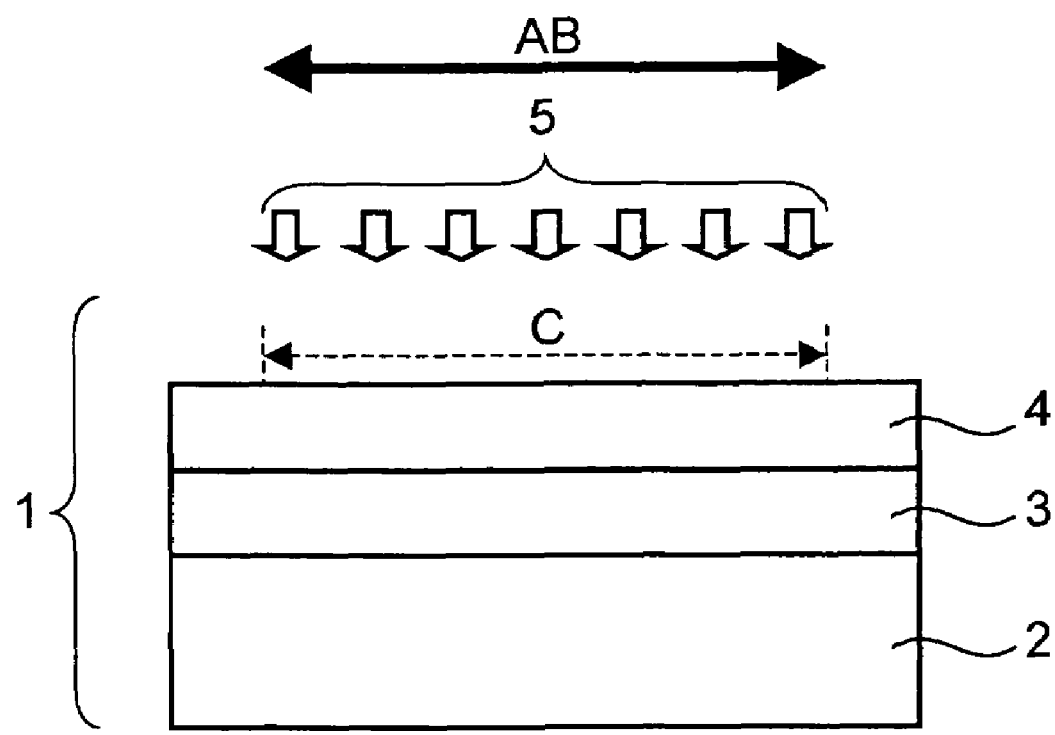

LASER BEAM PROJECTION MASK, AND LASER BEAM MACHINING METHOD AND LASER BEAM MACHINE USING SAME

CROSS-REFERENCE TO RELATED APPLICATIONS

This nonprovisional application claims priority under 35 U.S.C. 119 (a) of Japanese application No. 2004-186525 filed on Jun. 24, 2004, the contents of which are fully incorporated herein by reference.

BACKGROUND OF THE INVENTION

The present invention relates to a laser beam projection mask, a laser beam machining method and a laser beam machine used to crystallize amorphous materials, which are for use, for example, as semiconductor materials in semiconductor devices and the like, through laser beam irradiation.

While there is a method using single crystal silicon (Si) as a general manufacturing method for semiconductor devices, there is another manufacturing method, other than the manufacturing method, which uses silicon thin films produced by forming silicon thin films on glass substrates. Semiconductor devices manufactured with use of the silicon thin films formed on the glass substrates are used as part of image sensors and active-matrix liquid crystal displays.

Herein, in the liquid crystal display, the semiconductor device is used as a TFT (Thin Film Transistor) arranged as a regular array on a transparent substrate. Each transistor in the TFT functions as a pixel controller in the liquid crystal displays. It is to be noted that the TFTs in the liquid crystal displays are conventionally formed from amorphous silicon films.

However, in recent years, polycrystalline silicon films with high electron mobility is being used instead of amorphous silicon films with low electron mobility to manufacture TFT liquid-crystal displays having a strengthened TFT switching characteristic and an increased display speed. Herein, methods for manufacturing polycrystalline silicon films include, for example, a (ELC: Excimer Laser Crystallization) method to crystallize amorphous or microcrystalline silicon films deposited on substrates through irradiation of excimer laser beams.

The ELC method is generally composed of scanning samples at a constant rate while continuously irradiating a semiconductor film with a linear laser beam having a length of 200 to 400 mm and a width of 0.2 to 1.0 mm. In this case, a portion of the semiconductor film irradiated with the laser beam does not melt entirely along the thickness direction but melts while a part of the semiconductor film region remains.

Consequently, on the entire interface between a unmelted region and a melted region, crystalline nucleuses are produced at every place and crystals grow toward the uppermost layer of the semiconductor film, so that crystal grains with random orientation are formed and their crystal grain size becomes as small as 100 to 200 nm.

In the grain boundaries in polycrystalline silicon film, a number of unpaired electrons are present and form potential barriers so as to function as strong scatterers of carriers. Therefore, the TFTs formed from polycrystalline silicon films with a smaller number of grain boundaries, i.e., with a larger crystal grain size, generally have higher electron field-effect mobility.

However, as described above, the conventional ELC method involves vertical crystal growth in which crystallization occurs at random positions on the boundaries between the unmelt region and the melt region, which makes it difficult to obtain polycrystalline silicon films with a large grain size. Because of this reason, it was difficult to obtain TFTs with high electron field-effect mobility. Moreover, since crystallization occurs at random, such defects as structural heterogeneity among respective TFTs and heterogeneity in the switching characteristic of TFT arrays are generated. Moreover, when these defects are generated, the TFT liquid crystal displays suffer the problem that pixels with a high display speed and pixels with a low display speed are present in one display screen.

Accordingly, for obtaining TFT liquid crystal displays with higher performance, it is necessary to increase the crystal grain size of the polycrystalline silicon films and to control the orientation of silicon crystals. Eventually, for the purpose of obtaining polycrystalline silicon films having capability close to monocrystal silicon, a number of proposal has been made.

Among these proposals, the laser crystallization technique classified as "lateral growth method" in particular is attracting a lot of attentions since it can provide long crystals whose orientation is aligned in the growth direction of crystals (e.g., Japanese translation of PCT international application No. 2000-505241).

The method is to crystallize a semiconductor by irradiating the semiconductor with a pulse laser beam having a minute width by a laser beam machine as shown in FIG. 14 so as to melt and solidify a semiconductor film across the entire thickness-direction region of a laser irradiation region. According to the laser beam machine, an excimer laser beam emitted from a light source 211 travels through a variable attenuator 212, a varifocal field lens 213, a projection mask 214 and an image-forming lens 215 before being irradiated onto the upper surface of a semiconductor element 101. The semiconductor element 101 includes a transparent substrate having optical transparency. Herein, as shown in FIG. 12, the semiconductor element 101 is composed of a transparent substrate 102, a base film 103 formed on the transparent substrate 102 and a silicon film 104.

The steps in the method are shown below. First, as shown in FIG. 12, for forming a crystal region along an extending direction (AB direction as viewed in the drawing) of the semiconductor film 104 on the transparent substrate 102, heat is induced to a region C in the semiconductor film 104. The induction of heat is performed by exposing the semiconductor film 104 to a laser beam after the region other than the region C on the semiconductor film 104 is masked. By this, energy of a laser beam 105 irradiated onto the region C is converted to thermal energy so that heat can be induced to the region C in the semiconductor film 104 and the region C can be melted over the thickness of the semiconductor film 104.

Next, when the semiconductor film 104 melted in the region C is solidified by cooling, crystals grow from boundaries C1 and C2 between the region C and other regions toward the center of the region C as shown in FIG. 13A. It is to be noted that FIG. 13A is a top view of the semiconductor film 104 in FIG. 12.

Further, as shown in FIG. 13B, a new region D adjacent to the region C is so set as to include a portion where crystals are not formed in the region C, and is melted in the similar way as in the aforementioned steps. Then, when the semiconductor film 104 which were melt in the region D is solidified in a similar way, crystals grow in the region D as shown in FIG. 13C. By forming desired crystals along the extending direction of the semiconductor film 104 gradually by repeating such steps, semiconductor crystals of polycrystalline structure can be expanded as shown in FIG. 13D. This makes it possible to form a polycrystalline silicon film with a large crystal grain size.

By the way, energy of the leaser beam 105 incident into the semiconductor film 104 is ideally homogenized at positions with respect to a specified direction as shown in FIG. 15A. More particularly, the laser beam is deformed to have a homogeneous beam shape by a homogeneous optical system and is incident into the semiconductor film 104 as the leaser beam 105. Moreover, as shown in FIG. 15B, three slits 225 formed in the projection mask 214 are disposed at specified intervals, the respective slits 225 having a constant width and being formed almost equally with respect to a specified direction. Moreover, in another projection mask 231 shown in FIG. 15C, the shape of respective slits 232 (slit width in particular) is identical, and the respective slits 232 are disposed almost equally in a specified direction.

By irradiating the semiconductor film 104 with the leaser beam 105 which transmitted the slits 225, 232 in the projection masks 214, 231, a uniform crystal grain length can be obtained, which allows the semiconductor element 101 to move at an identical speed or move stepwise with an identical width.

However, the aforementioned prior art has a following problem. That is, the laser beam is designed to come incident in the state of being deformed to have a homogeneous beam shape by a homogeneous optical system for the purpose of obtaining a uniform crystal grain length.

However, parameters concerning crystallization itself regard heat generated by a laser beam. Therefore, when the semiconductor element 101 is scanned by a laser beam at a high speed for expanding a crystallized region, a laser beam distribution is not necessarily congruous with a heat distribution on the surface of the semiconductor film 104, which causes the problem that a uniform crystal grain length cannot be obtained.

In the case where such a uniform crystal grain length cannot be obtained, the slit width needs to be set in conformity with the minimum value of the crystal grain length for achieving seamless expansion of the crystallized region. However, when the crystal grain length is increased with the slit having such width the problem of deteriorated crystallinity occurs.

Further, although in the prior art, a laser beam is deformed to have a homogeneous beam shape by a homogeneous optical system, complete homogenization of the laser beam causes such problems as difficulty in adjustment associated with increase in the number of optical components and degradation in efficiency. Moreover, while there are cases of using first and second two laser beams for efficiently increasing the temperature of substrates and semiconductor materials, there is a problem that normal masks cannot cope with both the first laser beam and the second laser beam.

SUMMARY OF THE INVENTION

An object of the present invention is to provide a laser beam projection mask capable of suppressing deterioration of crystallinity attributed to inconformity between a distribution of a laser beam irradiated onto a irradiation subject and a distribution of the temperature on the irradiation subject for obtaining sufficient crystallinity, as well as a laser beam machining method and a laser beam machine using the same.

In order to achieve the above object, there is provided a laser beam projection mask comprising
a transmission area for transmitting a laser beam, wherein
the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction.

According to the laser beam projection mask in the present invention, inconformity between the distribution of a laser beam irradiated onto the irradiation subject and the distribution of the temperature on the irradiation subject may be suppressed. Therefore, even in the case where a uniform crystal grain length cannot be obtained, the crystallized region may be expanded without any problem so that the crystallinity is not deteriorated and excellent crystallinity may be achieved. Further, according to the laser beam projection mask in the present invention, it is not necessary to completely homogenize the incident laser beam, which allows the difficulty in adjustment of the optical system to be alleviated, and allows degradation in the efficiency of the laser beam to be reduced.

In one embodiment of the present invention, the transmission area is formed in a stair-shaped pattern toward the specified direction.

In the laser beam projection mask in the present embodiment, the stair-shaped pattern of the transmission area makes it possible to increase the relative moving speed and enhance the throughput.

In one embodiment of the present invention, the transmission area expands toward the specified direction.

In the laser beam projection mask in the present embodiment, it becomes possible to suppress the inconformity between the distribution of the laser beam irradiated onto irradiation subject and the distribution of the temperature on the irradiation subject in the case where the temperature generated on the irradiation subject in a specified direction increases toward the specified direction.

In one embodiment of the present invention, the transmission area shrinks toward the specified direction. Accordingly, in the laser beam projection mask in the present embodiment, it becomes possible to suppress the inconformity between the distribution of the laser beam irradiated onto irradiation subject and the distribution of the temperature on the irradiation subject in the case where the temperature generated on the irradiation subject in a specified direction decreases toward the specified direction.

In one embodiment of the present invention, the transmission area expands from an end portion to a central portion in the specified direction.

In this embodiment, in the case where the temperature generated on the irradiation subject increases from an end portion to a central portion in the specified direction, the inconformity between the distribution of the laser beam irradiated onto the irradiation subject and the distribution of the temperature on the irradiation subject may be suppressed.

Also, there is provided a laser beam machining method, in which the laser beam projection mask as defined in Claim 1 is used and a laser beam is projected and irradiated on an amorphous material layer forming a substrate or an amorphous material layer formed on the substrate via the laser beam projection mask so as to crystallize the amorphous material layer, comprising:

a first crystallizing step for irradiating an inside of a first region formed on a surface of the amorphous material layer with the laser beam via the laser beam projection mask to melt the amorphous material layer in the first region and solidifying and crystallizing the melted amorphous material in the first region;

a region moving step for moving a region irradiated with the laser beam from the first region in the specified direction for a specified distance and determining a second region formed on a surface of the amorphous material layer so as to be partially superposed on the first region immediately before the movement; and a second crystallizing step for irradiating an inside of the second region with the laser beam via the laser beam projection mask to melt an amorphous material in the second region and solidifying and crystallizing the melted amorphous material in the second region, wherein until a region in which the amorphous material is crystallized reaches a specified size, irradiation of the surface of the amorphous material layer with the laser beam and movement of the region irradiated with the laser beam are repeated.

According to the laser beam machining method of the present invention, the amorphous material layer is crystallized by projecting and irradiating the laser beam via the laser beam projection mask. Thereby, the inconformity between the distribution of the laser beam irradiated onto irradiation subject and the distribution of the temperature on the irradiation subject. Consequently, even in the case where a uniform crystal grain length cannot be obtained, the crystallized region may be expanded without any problem so that the crystallinity is not deteriorated and excellent crystallinity nay be achieved.

In one embodiment of the present invention, the laser beam irradiated onto the amorphous material via the laser beam projection mask is set as a first laser beam, and while the amorphous material is irradiated with the first laser beam, the amorphous material is irradiated with a second laser beam without via the laser beam projection mask.

In the laser beam machining method in the present embodiment, the amorphous material is irradiated with the second laser beam not via the laser beam projection mask, which makes it possible to reduce a temperature drop rate of the amorphous material layer and to considerably lengthen the lateral growth distance of semiconductor polycrystals.

In one embodiment of the present invention, in a spatial distribution of a temperature on the amorphous material layer forming a substrate or the amorphous material layer formed on the substrate, a temperature in a latter half region of the region irradiated with the laser beam with respect to a forward moving direction is set higher than a temperature in a former half thereof.

In the laser beam machining method in the present embodiment, in the case where the spatial distribution of the laser beam has a peak in the latter half in the forward direction, it becomes possible to suppress the inconformity between the distribution of the laser beam irradiated onto the irradiation subject and the distribution of the temperature on the amorphous material layer. Therefore, even in the case where a uniform crystal grain length cannot be obtained, the crystallized region may be expanded without any problem so that the crystallinity is not deteriorated and excellent crystallinity may be achieved.

In one embodiment of the present invention, a spatial distribution of intensity of the second laser beam is a distribution in which a top portion with respect to the specified direction is high and a rear portion following the top portion is low, and a spatial distribution of a temperature on the amorphous material layer forming a substrate or the amorphous material layer formed on the substrate is such that a temperature in a latter half region of the region irradiated with the laser beam with respect to a forward moving direction is set lower than a temperature in a former half thereof.

In the laser beam machining method in the present embodiment, in the case where the spatial distribution of the laser beam has a peak in the former half in the forward direction, it becomes possible to suppress the inconformity between the distribution of the laser beam irradiated onto the irradiation subject layer and the distribution of the temperature on the amorphous material layer. Therefore, even in the case where a uniform crystal grain length cannot be obtained, the crystallized region may be expanded without any problem so that the crystallinity is not deteriorated and excellent crystallinity may be achieved.

In one embodiment of the present invention, the spatial distribution of the intensity of the second laser beam is set in such a way that in the spatial distribution of the temperature on the amorphous material layer forming a substrate or the amorphous material layer formed on the substrate, a temperature of a central portion is higher than a temperature in a peripheral portion of the central portion and a temperature distribution in the peripheral portion is almost uniform.

In the laser beam machining method in the present embodiment, in the case where the spatial distribution of the temperature on the amorphous material layer is such that the temperature of the central portion is higher than the temperature in the peripheral portion of the central portion and the temperature distribution in the peripheral portion is almost uniform, it becomes possible to suppress the inconformity between the distribution of the laser beam irradiated onto the amorphous material layer and the distribution of the temperature on the amorphous material layer.

Also, there is provided a laser beam machine, comprising: a laser light source; and the laser beam projection mask as defined in Claim 1 for projecting and irradiating a laser beam on a layer made of a amorphous material forming a substrate or a layer made of a amorphous material formed on the substrate via a laser beam projection mask so as to crystallize the amorphous material by executing:

a first crystallizing step for irradiating an inside of a first region formed on a surface of the layer made of the amorphous material with the laser beam via the laser beam projection mask to melt the amorphous material layer in the first region and solidifying and crystallizing the melted amorphous material in the first region;

a region moving step for moving a region irradiated with the laser beam from the first region in a specified direction for a specified distance and determining a second region formed on a surface of the layer made of the amorphous material layer so as to be partially superposed on the first region immediately before the movement; and a second crystallizing step for irradiating an inside of the second region with the laser beam via the laser beam projection mask to melt an amorphous material in the second region and solidifying and crystallizing the melted amorphous material in the second region, and further comprising a control portion for executing control so as to form a crystallized region made of the amorphous material into an asymmetric shape by repeating irradiation of the surface of the layer made of the amorphous material with the laser beam and movement of the region irradiated with the laser beam until the region in which the amorphous material is crystallized reaches a specified size.

According to the laser beam machine in the present embodiment, by projecting and irradiating the laser beam on the amorphous material layer via the laser beam projection mask, the amorphous material layer is crystallized. This makes it possible to suppress the inconformity between the distribution of the laser beam irradiated onto the amorphous material layer and the distribution of the temperature on the amorphous material layer. Therefore, even in the case where a uniform crystal grain length cannot be obtained, the crystallized region may be expanded without any problem so that the crystallinity is not deteriorated and excellent crystallinity may be achieved.

Moreover, in crystallized devices manufactured by the laser beam machining method and the laser beam machine, the shape of the crystallized area formed through repeated crystallization process is asymmetric, so that producing switching elements and the like on the side of the larger crystallized area makes it possible to reduce crystal grain boundaries and enhance device characteristics. Particularly, in information displays having switching element disposed on the crystallized area, the reduced crystal grain boundaries allows enhanced device characteristics and reduced power consumption.

According to the laser beam projection mask in the present invention, the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in thea specified direction.

Therefore, it becomes possible to suppress the inconformity between the distribution of the laser beam irradiated onto the irradiation subject and the distribution of the temperature on the irradiation subject. Therefore, even in the case where a uniform crystal grain length cannot be obtained, the crystallized region may be expanded without any problem so that the crystallinity is not deteriorated and excellent crystallinity may be achieved. Further, according to the laser beam projection mask in the present invention, it is not necessary to completely homogenize the incident laser beam, which allows the difficulty in adjustment of the optical system to be alleviated, and allows degradation in the efficiency of the laser beam to be reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a cross sectional view showing a semiconductor device 1 irradiated with a laser beam by a laser beam machine having a laser beam projection mask in first to fourth embodiments of the present invention;

DETAILED DESCRIPTION OF THE INVENTION

The present invention is hereinbelow described in detail in conjunction with the embodiments accompanied by the drawings.

First Embodiment

Figure 2A:
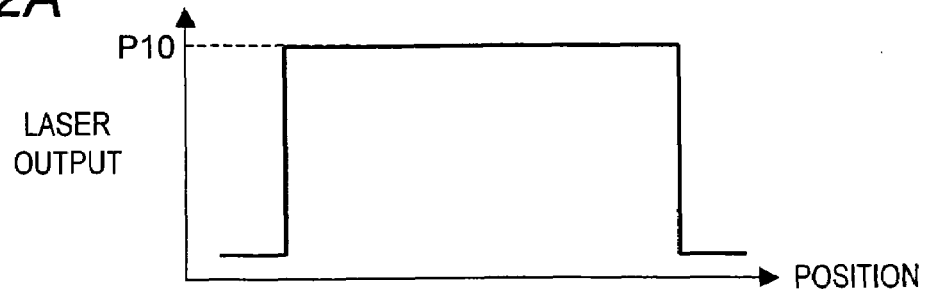
FIG. 2A is a waveform view showing a beam shape of a laser beam produced by a laser beam machine having a laser beam projection mask in the first embodiment of the present invention.
Figure 2B:
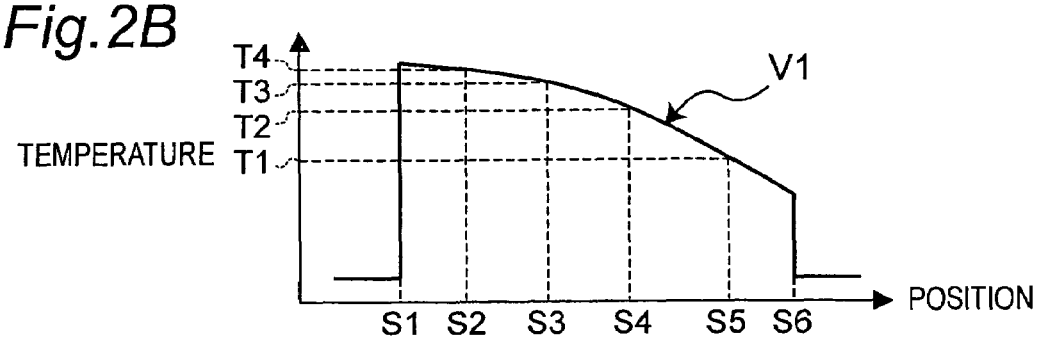
FIG. 2B is a temperature distribution view showing a temperature distribution formed in a silicon film as a result of irradiating the semiconductor device 1 with a laser beam by the laser beam machine.
Figure 2C:
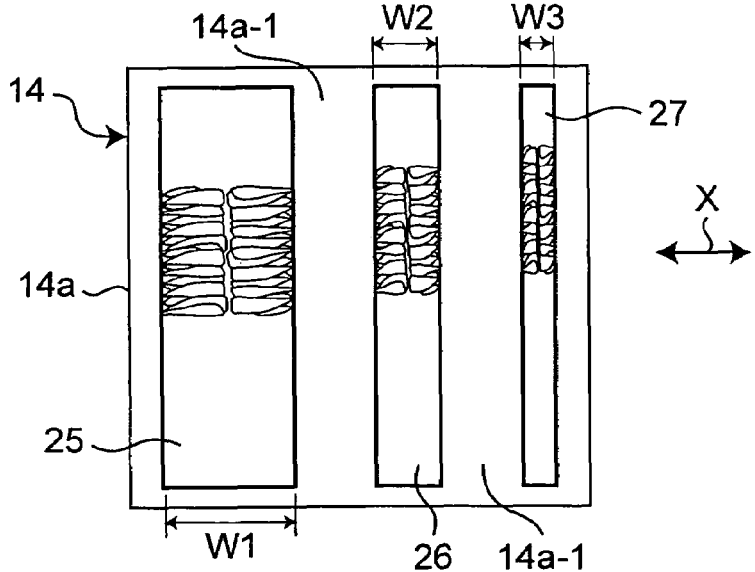
FIG. 2C is a schematic view schematically showing laser beam projection masks and crystal grains grown in conformity with the masks in the first embodiment.

FIG. 2C shows a laser beam projection mask 14 as a first embodiment of the present invention. The laser beam projection mask 14 has three rectangular-shaped slits 25, 26, 27 as the transmission areas. A frame portion 14a of the laser beam projection mask 14 is a non-transmission area which does not transmit laser beams. These three slits 25, 26, 27 are formed in sequence in X direction shown by an arrow X in FIG. 2C at specified intervals, and the width of these slits in the X direction decreases in the order of the slit 25, the slit 26 and the slit 27.

Figure 3:
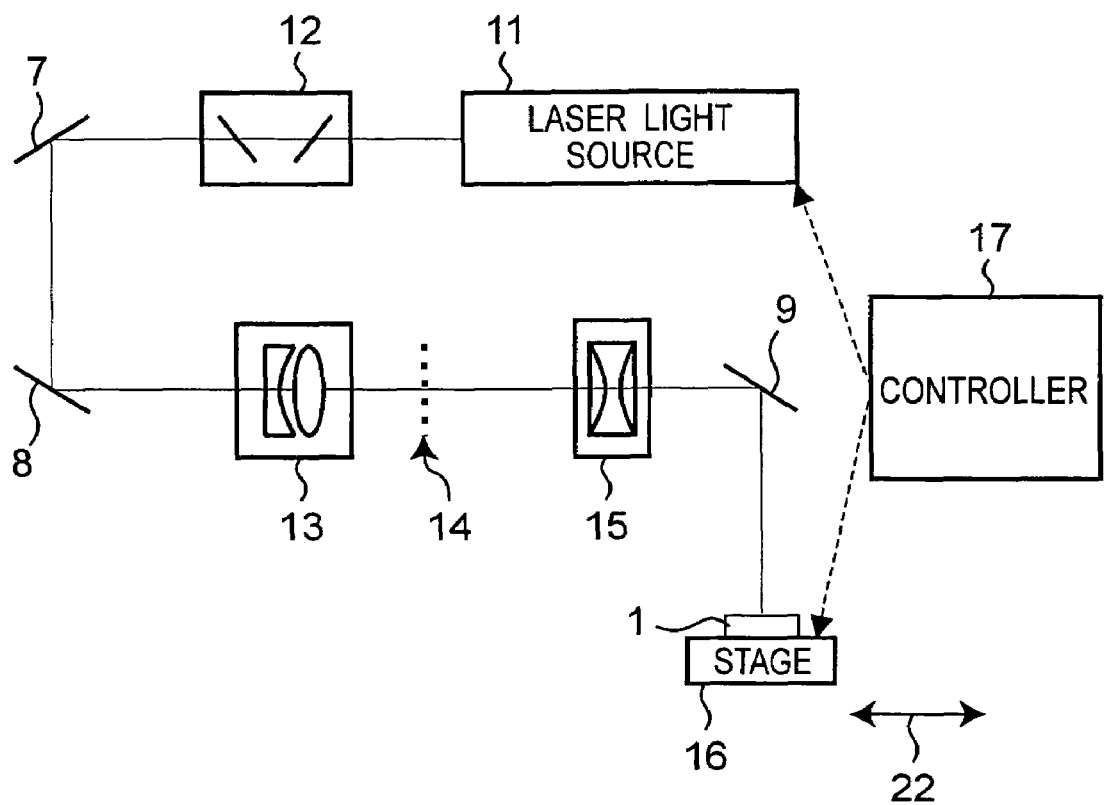
FIG. 3 is a view showing the structure of a laser beam machine having the laser beam projection mask in the first embodiment.

FIG. 3 shows a laser beam machine having the laser beam projection mask 14 and a laser light source 11. The laser beam machine embodies the laser beam machine in the present invention. In the laser beam machine, a laser beam emitted from the laser light source 11 travels through a variable attenuator 12, reflection mirrors 7, 8, a varifocal field lens 13, a projection mask 14, an image-forming lens 15 and a reflection mirror 9 before being irradiated onto the upper surface of a semiconductor device 1 mounted on a stage 16. Moreover, the laser beam machine has a controller 17 for controlling the stage 16 and the laser light source 11.

FIG. 2A shows a beam shape of an excimer laser beam emitted from the laser light source 11. In the present embodiment, the excimer laser beam emitted from the laser light source 11 is a short-pulsed excimer laser beam with a wavelength of 308 nm (XeCl) and a pulse width of 30 ns. Without being limited to the excimer laser beam, the laser beam emitted from the laser light source 11 may be other laser beams.

FIG. 1 shows the semiconductor device 1. The semiconductor device 1 is structured such that a base film 3 and a silicon film 4 are laminated in sequence on a transparent substrate 2 as the substrate. The materials for use as the base film 3 include dielectric materials made of $SiO_2$, SiON, SiN, AlN and the like. Although the base film 3 has a film thickness of 100 nm and a silicon film 4 has a film thickness of 50 nm in the present embodiment, the present invention is not limited to these values. The base film 3 is laminated on the transparent substrate 2 by evaporation, ion plating or sputtering, whereas the silicon film 4 is laminated on the base film 3 by Plasma Enhanced Chemical Vapor Deposition (PECVD), evaporation or sputtering. At this point, the silicon film 4 is in the sate of amorphous.

Description is now given of the steps of crystallizing the silicon film 4 by the laser beam machine.

A laser beam 5 emitted from the laser light source 11 travels through the variable attenuator 12, the reflection mirrors 7, 8, the varifocal field lens 13, the projection mask 14, the image-forming lens 15 and the reflection mirror 9 before being irradiated onto the upper surface of the silicon film 4 of the semiconductor device 1 mounted on the stage 16. By masking by the projection mask 14, the laser beam 5 is irradiated onto an irradiation region C shown in FIG. 1 as a pulsed laser beam with a minute width. Thus, the silicon film 4 as the semiconductor film is melted and solidified across the entire thickness-direction of the laser irradiation region C for crystallization (first crystallizing step).

The beam shape of the laser beam 5 is, as shown in FIG. 2A, a pulsed waveform with a constant laser output. The laser beam 5 is irradiated onto the laser irradiation region C of the silicon film 4 via the projection mask 14.

Next, the controller 17 controls the stage 16 so as to move it in a left-hand direction of an arrow 22 for a specified distance. With this movement, the silicon film 4 moves to a left-hand direction of an arrow AB in FIG. 1 for a specified distance (region moving step). Consequently, a surface region of the silicon film 4 irradiated with the laser beam 5 coming via the respective slits 25, 26, 27 in FIG. 2C becomes a second region which is away from the first region for a specified distance in X direction (right-hand direction of the arrow AB in FIG. 1). It is to be noted that the second region is a region partially superposed on the first region. In the present embodiment, movement of the stage 16 was performed three times. Further, the specified distance is, for example, a value larger than a width W of a column portion 14a-1 of a frame portion 14a of the projection mask 14.

Figure 2D:
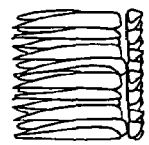
FIG. 2D is a schematic view showing crystal grains asymmetrically formed in lateral direction.

The stage 16 are moved three times and the surface of the silicon film 4 is irradiated with the laser beam 5 coming via the laser beam projection mask 14 so as to form asymmetric-shaped crystal grains in lateral direction (arrow AB direction in FIG. 1) as shown in the schematic view in FIG. 2D.

The schematic view of a temperature distribution generated in the laser irradiation region C by four laser irradiation operations accompanied by three moving operations is shown in FIG. 2B. As shown by a temperature distribution curve V1 in FIG. 2B, the temperature of the silicon film 4 decreases in the order of the positions S1, S2, S3, S4, S5, S6 with respect to a specified direction, the temperature being T4 at the position S2, the temperature being T3 at the position S3, temperature being T2 at the position S4, and the temperature being T1 at the position S5 (T1<T2<T3<T4). The specified direction is a direction of the arrow AB illustrated above the irradiation region C shown in FIG. 1, that is the direction from the left-hand side to the right-hand side in FIG. 1.

Then, in response to the temperature distribution curve V1 of the silicon film 4 decreasing toward the specified direction, the laser beam projection mask 14 has the slit 25 whose width W1 is larger than the width W2 of the slit 26 as shown in FIG. 2C. Further, the width W2 of the slit 26 is larger than the width W3 of the slit 27. It is to be noted that the specified direction is the X direction in FIG. 2C corresponds to the direction of the arrow AB in FIG. 1.

Moreover, schematically shown in the respective slits 25, 26, 27 in FIG. 2C are crystal grains grown in lateral direction (i.e., AB direction) by the laser beam 5 transmitted the respective slits 25, 26, 27 and irradiated onto the irradiation region C of the silicon film 4. More particularly, respective crystal grains shown in the respective slits 25, 26, 27 are the crystal grains crystallized through melting and solidification achieved by irradiation of the laser beam 5 onto the inside of the first region formed on the surface of the silicon film 4.

According to the laser beam machine having the laser beam projection mask 14 of the first embodiment as described above, the slits 25 to 27 constituting the transmission areas are formed so that when irradiation regions (first region and second region) on the silicon film 4 as the irradiation object irradiated with the transmitted laser beam 5 move relatively to the silicon film 4 in a specified direction AB, the distribution of the laser beam 5 irradiated onto the silicon film 4 in the specified direction AB corresponds to the distribution of the temperature on the silicon film 4 in the specified direction AB.

Therefore, it becomes possible to suppress a inconformity between the distribution of the laser beam 5 irradiated onto the silicon film 4 and the distribution of the temperature on the silicon film 4. Therefore, even in the case where a uniform crystal grain length cannot be obtained, the crystallized region may be expanded without any problem so that the crystallinity is not deteriorated and excellent crystallinity may be achieved. Further, according to the laser beam projection mask 14, it is not necessary to completely homogenize the laser beam incident into the mask 14, which allows the difficulty in adjustment of the optical system to be alleviated, and allows degradation in the efficiency of the laser beam to be reduced.

Second Embodiment

Figure 5A:
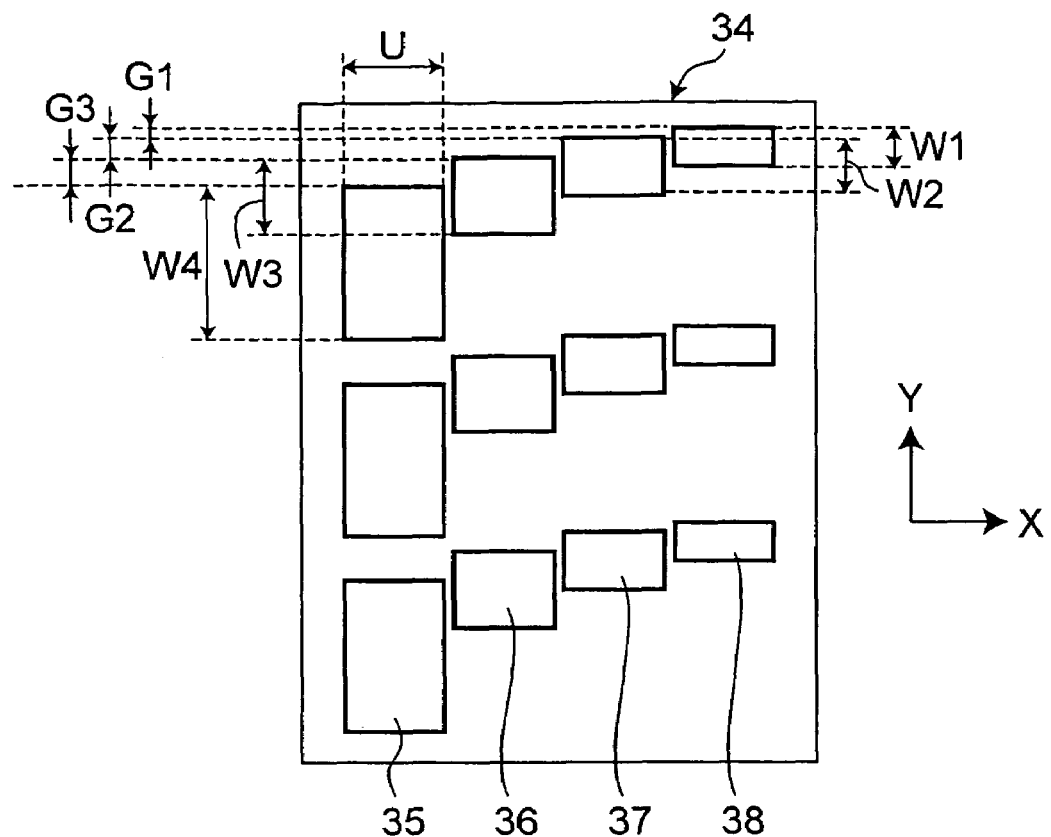
FIG. 5A is a plane view showing the laser beam projection mask in the second embodiment and FIG. 5B is a composite schematic view showing the shape of a crystallized area AR associated with slits 35 to 38.

Next, FIG. 5A shows a laser beam projection mask 34 as a second embodiment of the present invention. The laser beam projection mask 34 has four slits 35 to 38 formed in X direction shown in FIG. 5A at specified intervals. Moreover, three sets of the respective slits 35 to 38 are formed in Y direction orthogonal to the X direction at specified interval.

While the respective slits 35 to 38 share a size U, a size W4 of the slit 35 in Y direction is longer than a size W3 of the slit 36 in Y direction, and the size W3 of the slit 36 in Y direction is longer than a size W2 of the slit 37 in Y direction. Moreover, the size W2 of the slit 37 in Y direction is longer than a size W1 of the slit 38 in Y direction.

Moreover, as shown in FIG. 5A, the respective four slits 35 to 38 in the upper, middle and lower rows are disposed in a similar way in X direction. More particularly, the end side of the slit 36 in Y direction is displaced from the end side of the slit 35 in Y direction by a distance G3 in Y direction. Moreover, the end side of the slit 37 in Y direction is displaced from the end side of the slit 36 in Y direction by a distance G2 in Y direction. Further, the end side of the slit 38 in Y direction is displaced from the end side of the slit 37 in Y direction by a distance G1 in Y direction.

Figure 10:
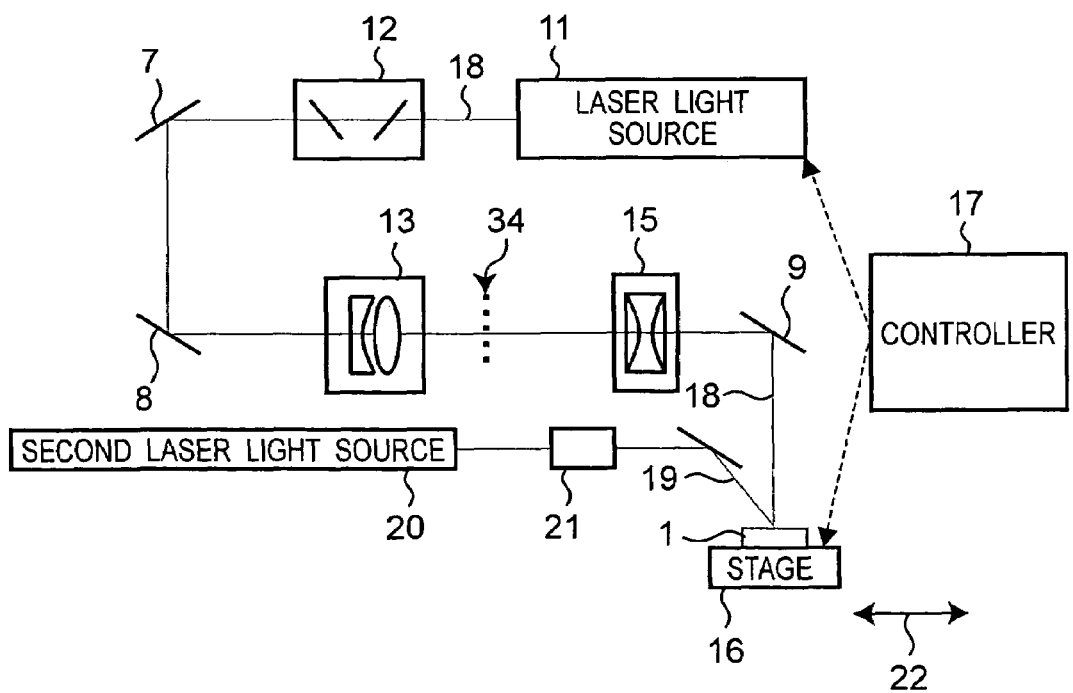
FIG. 10 is a view showing the structure of a laser beam machine having the laser beam projection mask in the second embodiment.

Next, FIG. 10 shows the structure of a laser beam machine having the projection mask 34. The laser beam machine has a first laser light source 11 and a second laser light source 20. A first laser beam 18 emitted from the laser light source 11 travels through a variable attenuator 12, reflection mirrors 7, 8, a varifocal field lens 13, a projection mask 14, an image-forming lens 15 and a reflection mirror 9 before being irradiated onto the upper surface of a semiconductor device 1 mounted on a stage 16 as in the laser beam machine shown in FIG. 3. Moreover, the laser beam machine has a controller 17 for controlling the stage 16 and the laser light source 11. Further, a second laser beam 19 emitted from the second laser light source 20 included in the laser beam machine travels through a homogeneous irradiation optical system 21 and a reflection mirror before being irradiated on the top face of the semiconductor device 1.

It is to be noted that the structure of the semiconductor device 1 is similar to the semiconductor device 1 shown in FIG. 1 described in the first embodiment and therefore description thereof is omitted herein.

The first laser beam 18 has a wavelength in which the range of absorptance to the silicon film 4 in a solid state is higher than that of the second laser beam 19. More specifically, the first laser beam 18 should preferably have a wavelength in an ultraviolet region.

The first laser beam 18 having such a wavelength in the ultraviolet region is exemplified by a excimer laser pulse with a wavelength of 308 nm. The first laser beam 18 should preferably have an energy amount for melting the silicon film 4 in a solid state. The energy amount changes according to a kind of the material of the silicon film 4, a film thickness of the silicon film 4 and an area of the crystallized region of the silicon film 4, and therefore cannot be defined uniquely. Therefore, it is desirable to use the first laser beam 18 which has an appropriate energy amount accordingly in compliance with the respective conditions in the silicon film 4. This applies to the case where semiconductor films of other kinds are crystallized instead of the silicon film 4. More specifically, it is recommended to use the first laser beam 18 which has an energy amount capable of heating the silicon film 4 as the semiconductor film across the entire film thickness to the temperature equal to or more than a melting point.

Further, the second laser beam 19 should preferably have a wavelength in which the range of absorptance to the silicon film 4 in a solid state is higher than that of the second laser beam 19. More specifically, the second laser beam 19 should preferably have a wavelength in the range from a visible range to an infrared region. The second laser beam 19 is exemplified by a YAG laser beam with a wavelength of 532 nm, a YAG laser beam with a wavelength of 1064 nm and a carbon dioxide gas laser beam with a wavelength of 10.6 μm. Moreover, the second laser beam 19 should preferably have an energy amount which does not melt the silicon film 4 in a solid state. The energy amount changes according to a kind of the material of the silicon film 4 as the semiconductor film, a film thickness of the silicon film 4 as the semiconductor film and an area of the crystallized region, and therefore cannot be defined uniquely. Therefore, it is desirable to use the second laser beam 19 which has an appropriate energy amount accordingly in compliance with the respective conditions in the silicon film 4. More specifically, in the case of solely irradiating the second laser beam 19, it is recommended to use the second laser beam 19 which cannot heat the silicon film 4 to the temperature equal to or more than the melting point. This applies to the case where semiconductor films of other kinds are employed instead of the silicon film 4.

Moreover, the laser beam machine shown in FIG. 10 can launch, for example, the first laser beam 18 into the top surface of the silicon film 4 in the semiconductor device 1 from vertical direction and can launch the second laser beam 19 into the top surface of the silicon film 4 from oblique direction.

It is to be noted that the laser light source 11 shown in FIG. 10 has only to be a laser oscillator capable of radiating a laser beam and melting silicon and so is not particularly limited, though the laser light source 11 should desirably be a laser oscillator having a wavelength in the ultraviolet region such as various solid state lasers typified by excimer lasers and YAG lasers. Among those described above, particularly an excimer laser oscillator with a wavelength of 308 nm capable of pulse radiation is preferable as the laser oscillator constituting the first laser light source 11. Desirable as the oscillator constituting the second laser light source 20 are those capable of radiating the second laser beam 19 having a wavelength absorbed by a melted-state semiconductor film typified by melted silicon.

Figure 11:
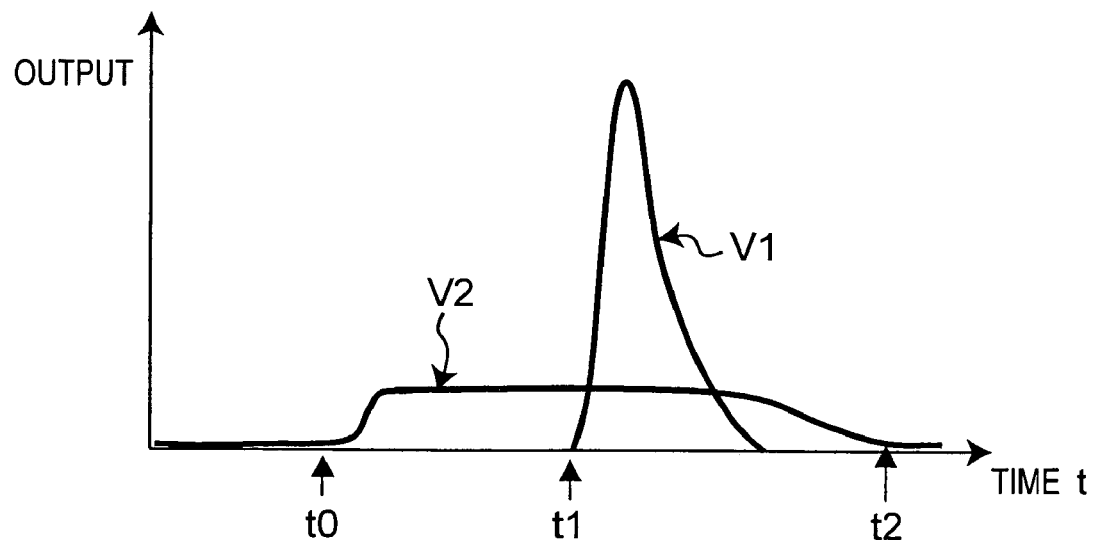
FIG. 11 is a waveform view showing an irradiation timing of a first laser beam and a second laser beam in the laser beam machine of FIG. 10.
Figure 12:
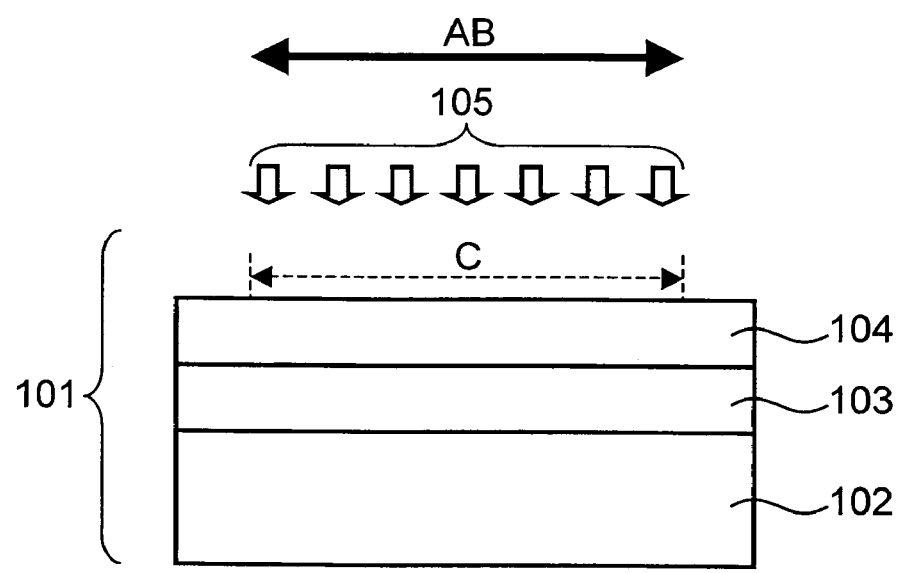
FIG. 12 is a cross sectional view showing a semiconductor device 101 in which a laser beam is irradiated by a laser beam machine having a laser beam projection mask in the conventional example.
Figure 13A:
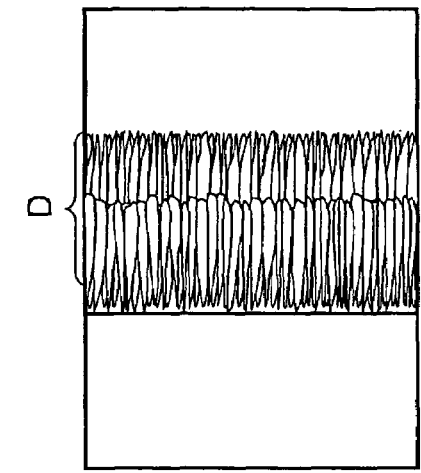
FIG. 13A to FIG. 13D are schematic views showing the states of growing crystals on a semiconductor film in sequence by the conventional laser beam machine.
Figure 13B:
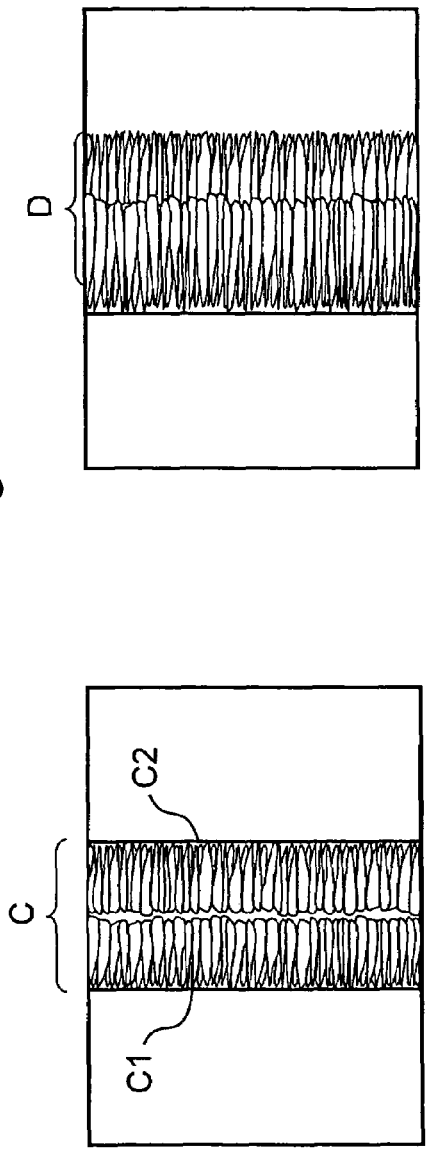
Figure 13C:
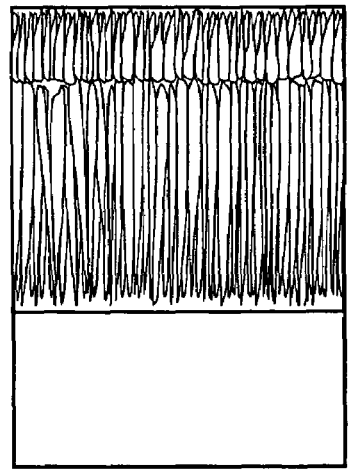
Figure 13D:
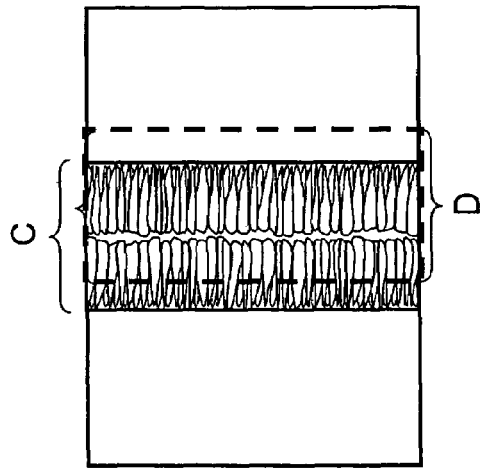
Figure 14:
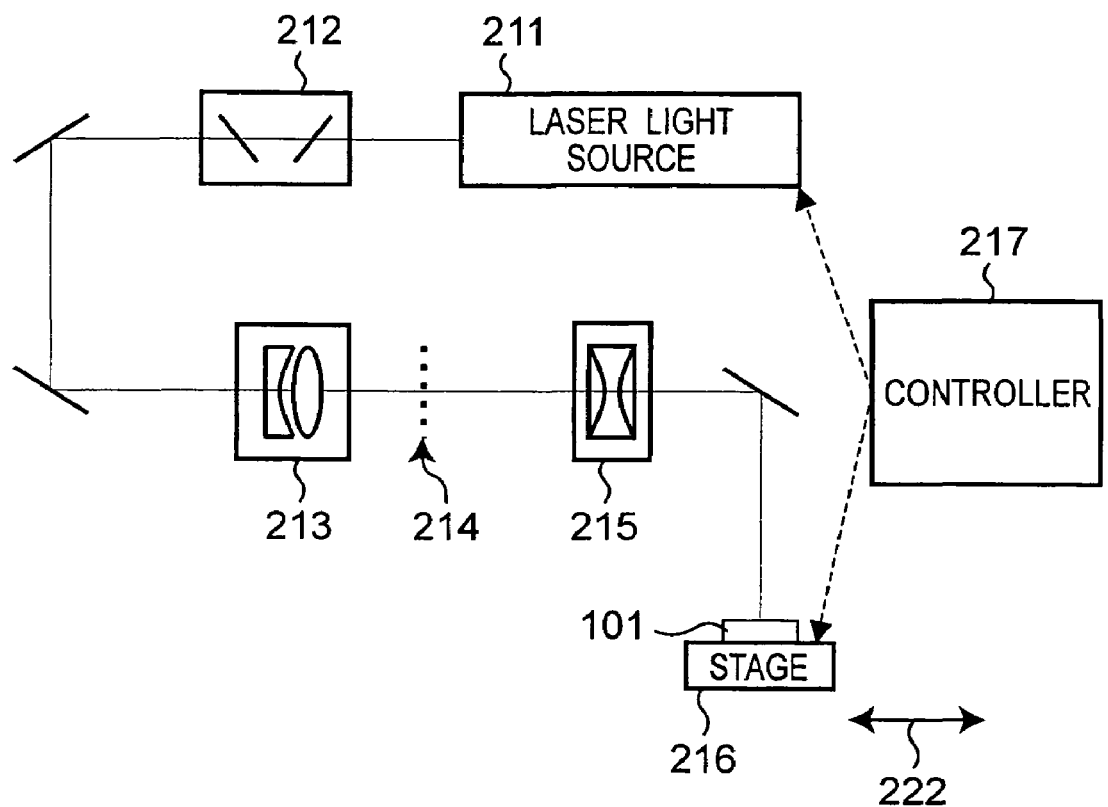
FIG. 14 is a view showing the structure of the conventional laser beam machine.
Figure 15A:
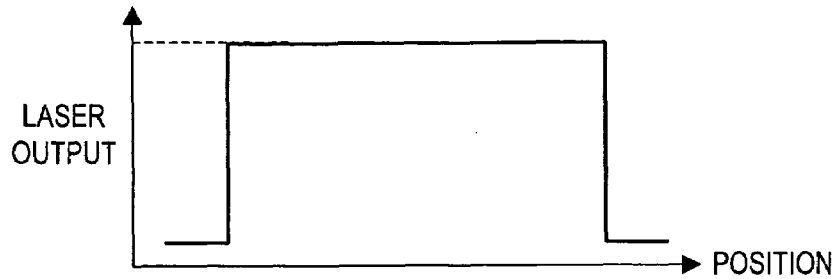
FIG. 15A is a waveform view showing a shape of a laser beam produced by the conventional laser beam machine.
Figure 15B:
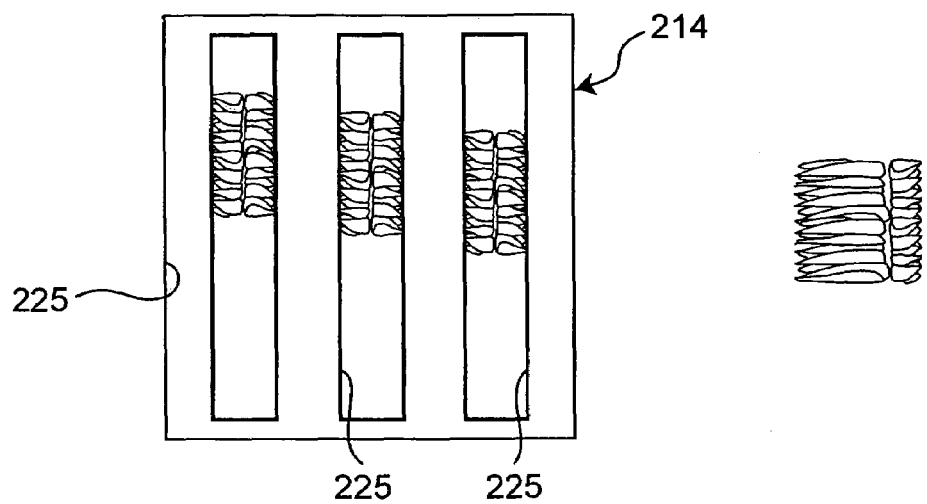
FIG. 15B is a plane view showing a laser beam projection mask 214 included in the conventional laser beam machine.
Figure 15C:
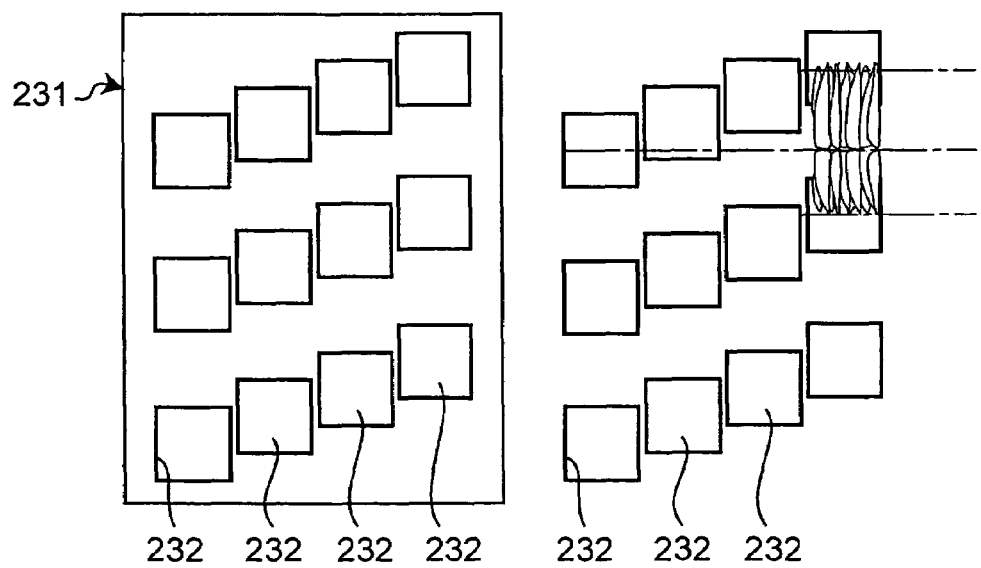
FIG. 15C is a composite schematic view schematically showing the conventional laser beam projection mask 231, slits of the mask and the crystal grain grown in conformity with the slits.

Herein, FIG. 11 shows one example of output waveforms of the first and second laser beams 18, 19. In FIG. 11, the characteristic V1 denotes a time and an output of the first laser beam 18 emitted by the first laser light source 11, while the characteristic V2 denotes a time and an output of the second laser beam 19 emitted from the second laser light source 20. As is clear from the comparison between the characteristics V1 and V2, the second laser beam 19 is emitted during the period from time t0 to t2, whereas the first laser beam 18 is emitted during the period from time t1 after the time t0 to before the time t2. More particularly, the emitting period of the first laser beam 18 is less than half of the emitting period of the second laser beam 19, whereas an output peak value of the first laser beam 18 is several times larger than an output peak value of the second laser beam 19. While the relation between the radiation time and the output of the first laser beam 18 and the second laser beam 19 is not limited to the relation shown in FIG. 11, the relation should preferably be similar to the relation of the characteristics shown in FIG. 11.

It is to be noted that as described below, during the period from the time t1 to t2 in FIG. 11, the silicon film 4 as the semiconductor film is in a melted state.

The silicon film 4 in a liquid state that is a precursor to a semiconductor thin film is irradiated with the second laser beam 19 in addition to the first laser beam 18, so that the temperature drop rate of the silicon film 4 that is a precursor to the semiconductor thin film may be reduced and a period of time till solidification may be prolonged. This allows considerable elongation of a lateral growth distance of semiconductor polycrystals generated by solidification of the silicon film 4 in a liquid state that is a precursor to the semiconductor thin film.

Description is herein given of the step of forming a crystallized region in the silicon film 4 by irradiating the silicon film 4 in the semiconductor device 1 shown in FIG. 1 with the first laser beam 18 and the second laser beam 19 by the laser beam machine shown in FIG. 10.

First, in the first crystallizing step, with the timing shown in the characteristic V1 in FIG. 11, the first laser beam 18 emitted from the first laser light source 11 is irradiated onto the inside of the first region formed on the surface of the silicon film 4 via the respective slits 35 to 38 of the laser beam projection mask 34. Also with the timing shown in the characteristic V2 in FIG. 11, the second laser beam 19 emitted from the second laser light source 20 is also irradiated onto the surface of the silicon film 4. The irradiation melts the silicon film 4 in the first region and the melted silicon film 4 in the first region is solidified for crystallization.

Next, in the region moving step, the controller 17 moves the stage 16 only for a specified distance in a left-hand direction of the arrow 22 in FIG. 10. By this movement, the silicon film 4 moves only for a specified distance in a left-hand direction of the arrow AB in FIG. 1.

Next, in the second crystallizing step, with the timing of the characteristic V1, the first laser beam 18 is emitted from the first laser light source 11 and is transmitted through the respective slits 35 to 38 of the projection mask 34 in FIG. 5A before the laser beam 5 made of the first laser beam 18 is irradiated onto the surface of the silicon film 4. The irradiation region is a second region, which is partially superposed on the first region. Moreover, the moving distance may be, as one example, a size U of the respective slits 35 to 38 in X direction. Moreover, like the first crystallizing step, with the timing shown by the characteristic V2 in FIG. 8, the second laser beam 19 emitted from the second laser light source 20 is also irradiated onto the surface of the silicon film 4. The irradiation melts the silicon film 4 in the first region and the melted silicon film 4 in the first region solidifies for crystallization.

Figure 5B:
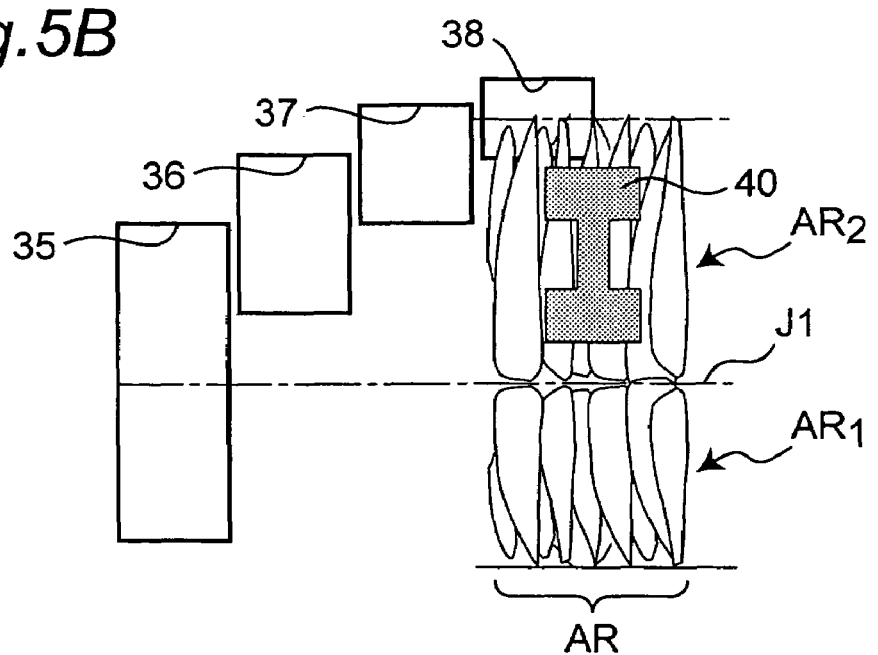

Further, till the crystallized region in the silicon film 4 reaches a specified size, irradiation of the surface of the silicon film 4 with the first and second laser beams 18, 19 and movement of the stage 16 are repeated a plurality of times. By this, as schematically shown in FIG. 5B as one example, a crystallized area AR asymmetrically grown in lateral direction corresponding to Y direction of the projection mask 34 may be formed. It is to be noted that in FIG. 5B, the respective slits 35 to 38 of the projection mask 34 and the crystallized area AR formed on an irradiation area on the surface of the silicon film 4 irradiated with a laser light coming through the respective slits 35 to 38 are illustrated in the state of being schematically combined for easy understanding of the associated relation therebetween.

Figure 4A:
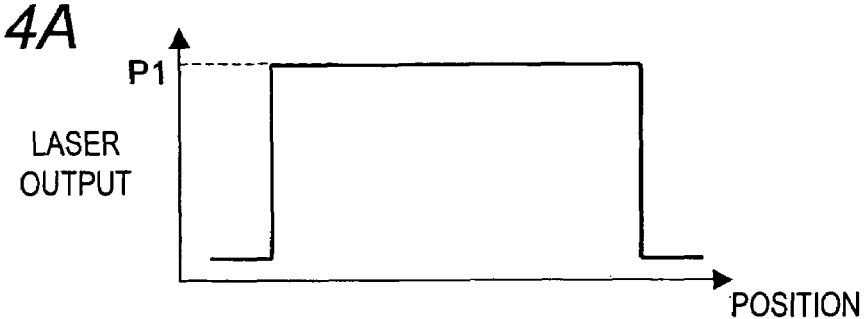
FIG. 4A is a waveform view showing a beam shape of a laser beam produced by a laser beam machine having a laser beam projection mask in the second embodiment of the present invention.
Figure 4B:
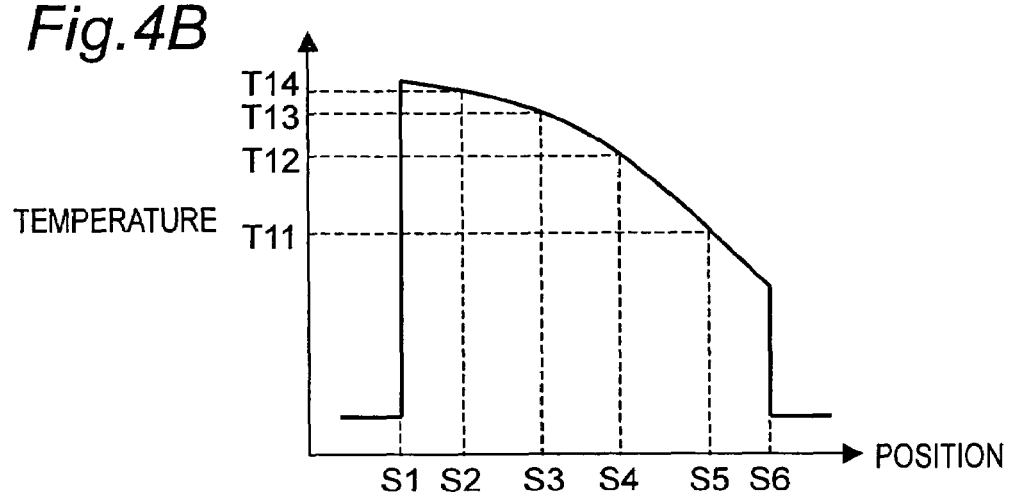
FIG. 4B is a temperature distribution view showing a temperature distribution formed in a silicon film as a result of irradiating the semiconductor device 1 with a laser beam by the laser beam machine.

For considerable elongation of the lateral growth distance, the temperature of the silicon film 4 during laser irradiation increases, which leads to increase in a temperature distribution after the silicon film 4 is irradiated with the first laser beam 18 and the second laser beam 19 a plurality of times. This will be described with reference to one example shown in FIGS. 4A and 4B. For example, FIG. 4A shows a beam shape of an excimer laser beam constituting the first laser beam 18. FIG. 4B shows an outlined temperature distribution generated on the irradiation area in the above-stated step in which the first laser beam 18 is transmitted through the projection mask 34 and irradiated onto the surface of the silicon film 4 a plurality of times. In FIG. 4B, positions on the surface of the silicon film 4 are expressed as S1, S2, S3, S4, S5, S6 in the order of the left-hand side to the right-hand side in the AB direction shown in FIG. 1. From the positions S1 to S6 (corresponding to X direction in FIG. 5A), the surface temperature of the silicon film 4 decreases. It is to be noted that the temperature distribution shown in FIG. 4B is substantially higher than the temperature distribution shown in FIG. 2B.

Figure 4C:
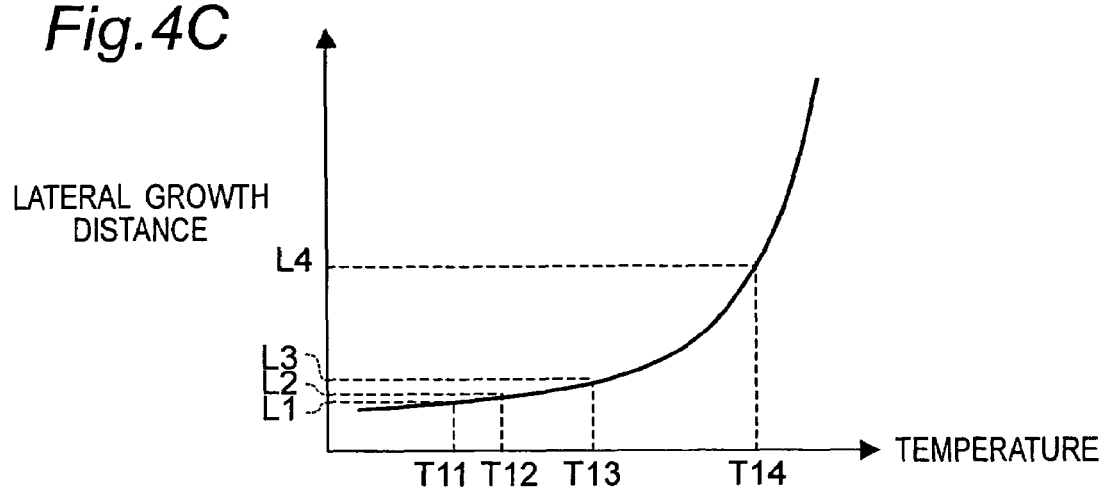
FIG. 4C is a characteristic view showing the change of a lateral growth distance in conformity with the temperature distribution of FIG. 4B.

Moreover, FIG. 4C shows the change in lateral growth distance in accordance with the temperature distribution T11 to T14 in FIG. 4B. Surface temperatures T11, T12, T13, T14 of the silicon film 4 respectively correspond to lateral growth distances L1, L2, L3, L4, and the more the temperature increases, the larger the lateral growth distance becomes.

In response to this, in the laser beam projection mask 34 of the second embodiment as aforementioned with reference to FIG. 5A, transmission coefficients of the laser beam decrease toward X direction by the presence of the transmission areas constituted of the slits 35 to 38. More particularly, the sizes W4 to W1 of the respective slits 35 to 38 in Y direction correspond to the lateral growth distances L4 to L1.

Moreover, in the laser beam projection mask 34 of the second embodiment as shown in FIG. 5A, the respective slits 36, 37, 38 are sequentially displaced from the slits 35, 36, 37 by the distances G3, G2, G1 in Y direction as described before. Thus, in the projection mask 34, the slits 36 to 38 are disposed in a stair-shaped pattern. The disposition of the slits 36 to 38 in the stair-shaped pattern makes it possible to increase the moving speed of the stage 16 and enhance the throughput.

Herein, the relation between the sizes (slit widths) W4 to W1 of the slits 35 to 38 in Y direction and the lateral growth distances L4 to L1 corresponding to the respective slit widths W4 to W1 in the laser beam projection mask 34 shown in FIG. 5A is defined in the following equation (1). Moreover, the relation between the lateral growth distances L4 to L2 and the displacement distances G3 to G1 is defined in the following equation (2).

$$Wn = 2 \times Ln \quad (n=1\sim4) \tag{1}$$

$$0.5Ln < G_{(n-1)} < Ln \quad (n=2\sim4) \tag{2}$$

As shown in one example in FIG. 5B, the shape of the crystallized area AR formed through the aforementioned repeated crystallization process is asymmetric with respect to an axis J1 in X direction. Moreover, as shown in this example, a semiconductor device 40 in the shape of an upset letter H is formed in an area $AR_2$ which is larger among an area $AR_1$ and the area $AR_2$ both constituting the crystallized area AR. Therefore, according to the crystallized area AR, disposing the semiconductor device 40 such as switching elements in the larger crystallized area $AR_2$ allows decreased crystal grain boundaries, enhanced device characteristics and reduced power consumption, compared to the case where the crystallized area is symmetric with respect to the axis J1.

It is to be noted that in the laser beam machine having the second embodiment, the first laser beam 18 may be irradiated onto an irradiation region on the silicon film 4 in which a mask image presented by the first laser beam 18 transmitted through the projection mask 34 is projected in the state of being reduced. In this case, it is desirable to set the irradiation region of the second laser beam 19 larger than the irradiation region of the first laser beam 18 so that the irradiation region of the second laser beam 19 includes the irradiation region of the first laser beam 18. Further in this case, it is desirable to irradiate the second laser beam 19 also at least during melting process of the silicon film 4.

Third Embodiment

Figure 7:
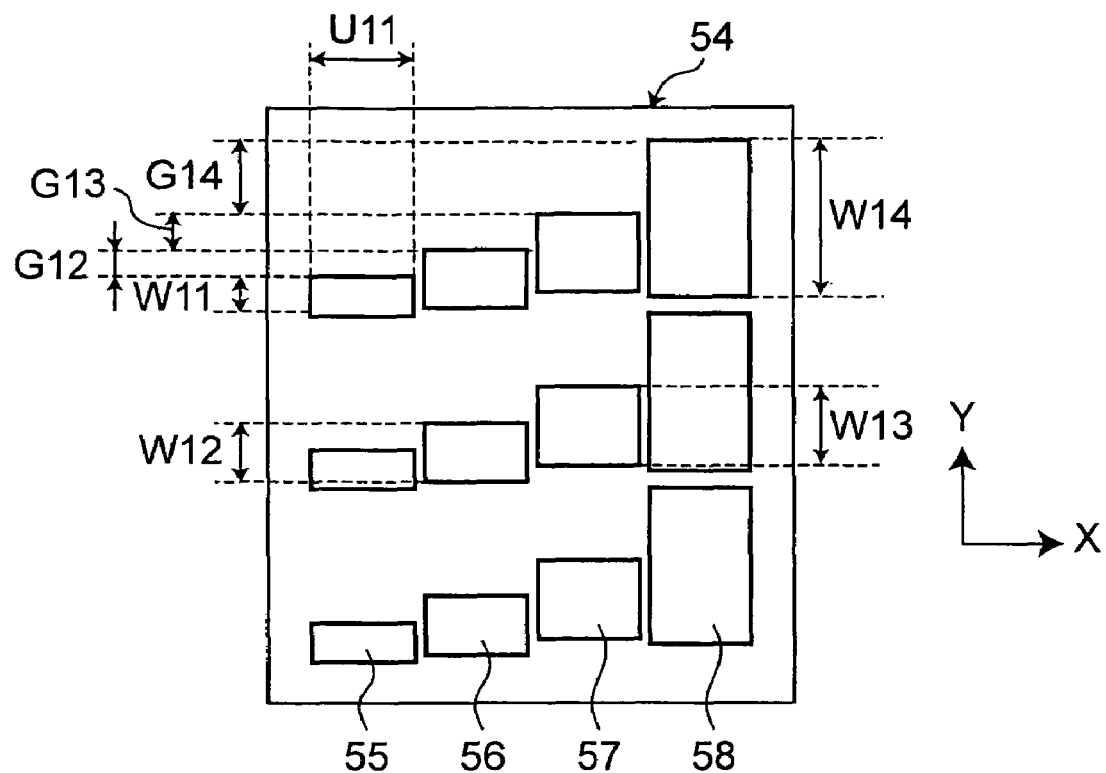
FIG. 7 is a plane view showing the laser beam projection mask in the third embodiment.

Next, FIG. 7 shows a laser beam projection mask 54 as a third embodiment of the present invention. The laser beam projection mask 54 has four slits 55 to 58 formed in X direction shown in FIG. 7 at specified intervals. Moreover, three sets of the respective slits 55 to 58 are formed in Y direction orthogonal to the X direction at specified interval. While the respective slits 55 to 58 share a size U11, a size W11 of the slit 55 in Y direction is shorter than a size W12 of the slit 56 in Y direction, and the size W12 of the slit 56 in Y direction is shorter than a size W13 of the slit 57 in Y direction. Moreover, the size W13 of the slit 57 in Y direction is shorter than a size W14 of the slit 58 in Y direction.

Moreover, as shown in FIG. 7, the respective four slits 55 to 58 in the upper, middle and lower rows are disposed in a similar way in X direction. More particularly, the end side of the slit 56 in Y direction is displaced from the end side of the slit 55 in Y direction by a distance G12 in Y direction. Moreover, the end side of the slit 57 in Y direction is displaced from the end side of the slit 56 in Y direction by a distance G13 in Y direction. Further, the end side of the slit 58 in Y direction is displaced from the end side of the slit 57 in Y direction by a distance G14 in Y direction.

A laser beam machine shown in FIG. 10 may has the laser beam projection mask 54 in the third embodiment instead of the laser beam projection mask 34 in the above-described second embodiment. As for the step of irradiating the silicon film 4 with the first and second laser beams 18, 19 by the laser beam machine in this case, description of the portion similar to those already described in the second embodiment will be omitted herein.

Figure 6A:
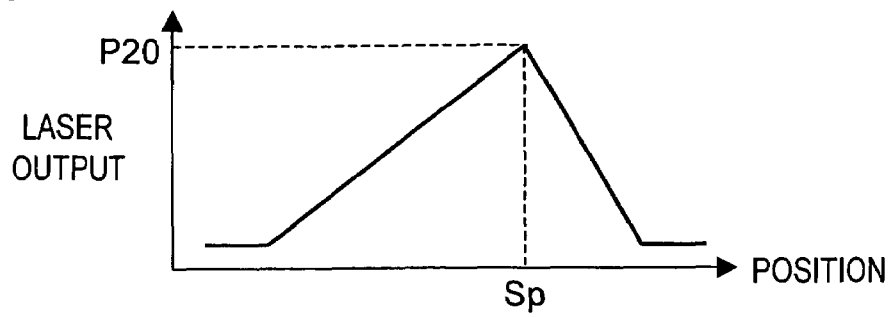
FIG. 6A is a waveform view showing a beam shape of a laser beam produced by a laser beam machine having a laser beam projection mask in the third embodiment of the present invention.

In the laser beam machine having the third embodiment, the beam shape of a second laser beam 19 emitted from a second laser light source 20 is different from that in the laser beam machine in the second embodiment described above. More particularly, in the laser beam machine having the third embodiment, the second laser beam 19 emitted from the second laser light source 20 has an asymmetric beam shape having a peak at a position Sp on the top side in forward direction in an irradiation region on the silicon film 4 as shown in FIG. 6A. It is to be noted that the beam shape of the first laser beam 18 is identical to that in the laser beam machine in the second embodiment.

Figure 6B:
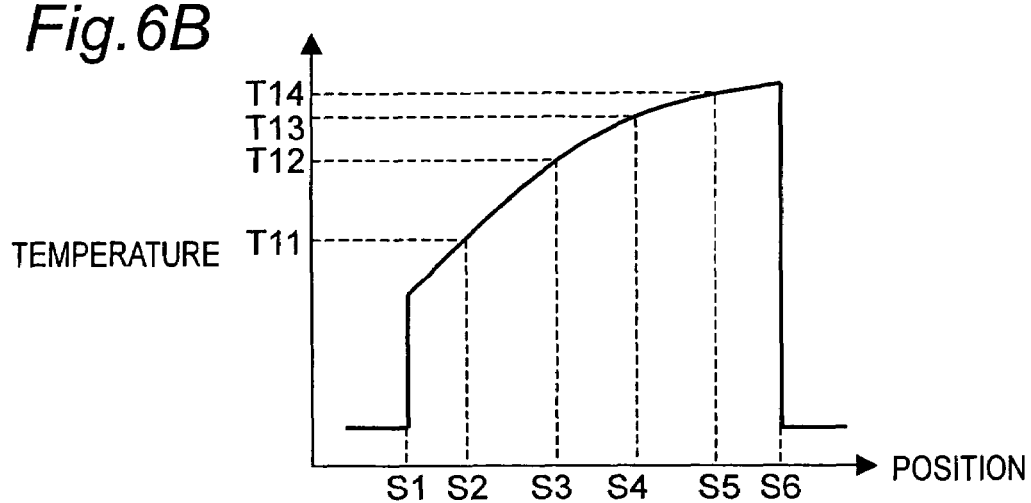
FIG. 6B is a temperature distribution view showing a temperature distribution formed in a silicon film as a result of irradiating the semiconductor device 1 with a laser beam by the laser beam machine.

With use of the first laser beam 18 and the second laser beam 19 in the beam shape shown in FIG. 6A, the surface of the silicon film 4 is irradiated with the first laser beam 18 and the second laser beam 19 transmitted through the projection mask 54 a plurality of times through the same step as in the laser beam machine in the second embodiment. As a result, a temperature distribution as shown in FIG. 6B is generated on the surface of the silicon film 4. In FIG. 6B, positions on the surface of the silicon film 4 are expressed as S1, S2, S3, S4, S5, S6 in the order of the left-hand side to the right-hand side in AB direction shown in FIG. 1. From the positions S1 to S6 (corresponding to X direction in FIG. 5B), the surface temperature of the silicon film 4 increases. It is to be noted that the temperature distribution shown in FIG. 6B is higher toward the top portion in the forward direction inversely with the temperature distribution shown in FIG. 4B.

Figure 6C:
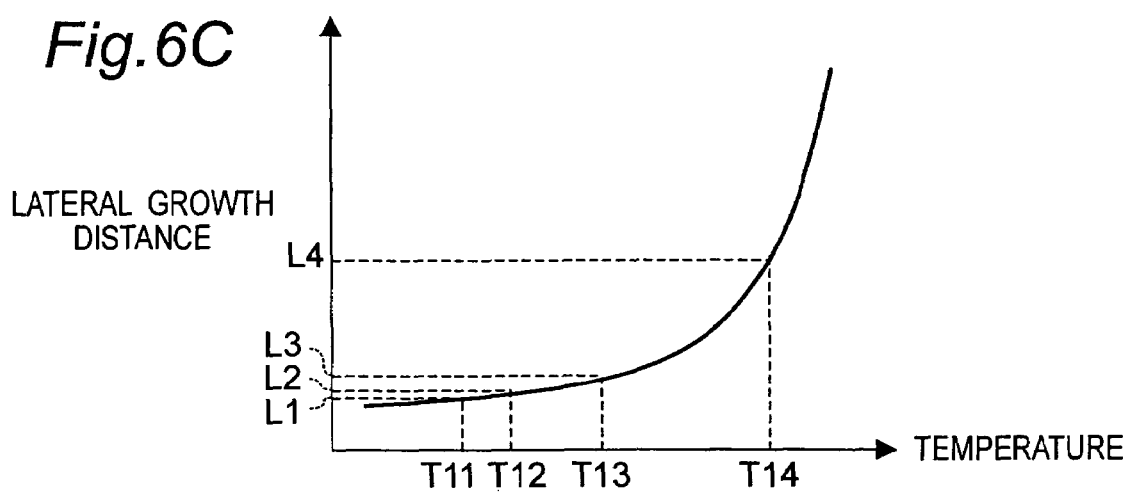
FIG. 6C is a characteristic view showing the change of a lateral growth distance in conformity with the temperature distribution of FIG. 6B.

Moreover, FIG. 6C shows the change in lateral growth distance in accordance with the temperature distribution T11 to T14 in FIG. 6B. Surface temperatures T11, T12, T13, T14 of the silicon film 4 respectively correspond to lateral growth distances L1, L2, L3, L4, and the more the temperature increases, the larger the lateral growth distance becomes.

In response to this, in the laser beam projection mask 54 of the third embodiment as aforementioned with reference to FIG. 5B, transmission coefficients of the laser beam increase toward X direction by the presence of the transmission areas constituted of the slits 55 to 58. More particularly, the sizes W11 to W14 of the respective slits 55 to 58 in Y direction correspond to the lateral growth distances L4 to L1.

Moreover, in the laser beam projection mask 54 of the third embodiment as shown in FIG. 7, the respective slits 56, 57, 58 are sequentially displaced from the slits 55, 56, 57 by the distances G12, G13, G14 in Y direction as described before. Thus, in the projection mask 54, the slits 56 to 58 are disposed in a stair-shaped pattern. The disposition of the slits 56 to 58 in the stair-shaped pattern makes it possible to increase the moving speed of the stage 16 and enhance the throughput.

Herein, the relation between the sizes (slit widths) W11 to W14 of the slits 55 to 58 in Y direction and the lateral growth distances L4 to L1 corresponding to the respective slit widths W11 to W14 in the laser beam projection mask 54 shown in FIG. 7 is defined in the following equation (3). Moreover, the relation between the lateral growth distances L4 to L2 and the displacement distances G14 to G12 is defined in the following equation (2).

$$W1n = 2 \times Ln (n=1\sim 4) \quad (3)$$

$$0.5Ln < G1n < Ln (n=2\sim 4) \quad (4)$$

Fourth Embodiment

Figure 9:
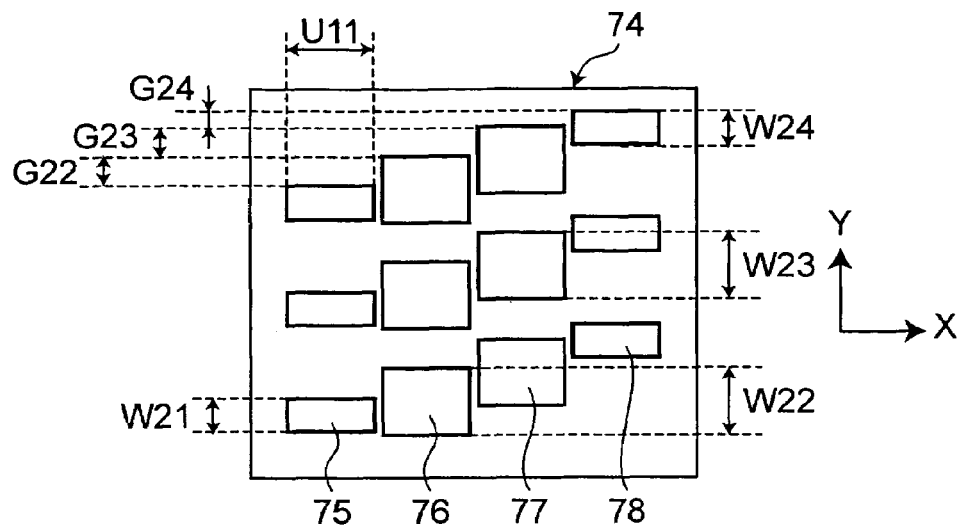
FIG. 9 is a plane view showing the laser beam projection mask in the fourth embodiment.

Next, FIG. 9 shows a laser beam projection mask 74 as a fourth embodiment of the present invention. The laser beam projection mask 74 has four slits 75 to 78 formed in X direction shown in FIG. 9 at specified intervals. Moreover, three sets of the respective slits 75 to 78 are formed in Y direction orthogonal to the X direction at specified interval. The respective slits 75 to 78 share a size U11.

A size W21 of the slit 75 in Y direction is almost identical to a size W24 of the slit 78 in Y direction, and a size W22 of the slit 76 in Y direction is almost identical to a size W23 of the slit 77 in Y direction. Also the size W22 in Y direction is almost twice the size W21 in Y direction.

Moreover, as shown in FIG. 9, the respective four slits 75 to 78 in the upper, middle and lower rows are disposed in a similar way in X direction. More particularly, the end side of the slit 76 in Y direction is displaced from the end side of the slit 75 in Y direction by a distance G22 in Y direction. Moreover, the end side of the slit 77 in Y direction is displaced from the end side of the slit 76 in Y direction by a distance G23 in Y direction. Further, the end side of the slit 78 in Y direction is displaced from the end side of the slit 77 in Y direction by a distance G24 in Y direction.

The laser beam machine shown in FIG. 10 may has the laser beam projection mask 74 in the fourth embodiment instead of the laser beam projection mask 34 in the above-described second embodiment. As for the step of irradiating the silicon film 4 with the first and second laser beams 18, 19 by the laser beam machine in this case, description of the portion similar to those already described in the second embodiment will be omitted herein.

Figure 8A:
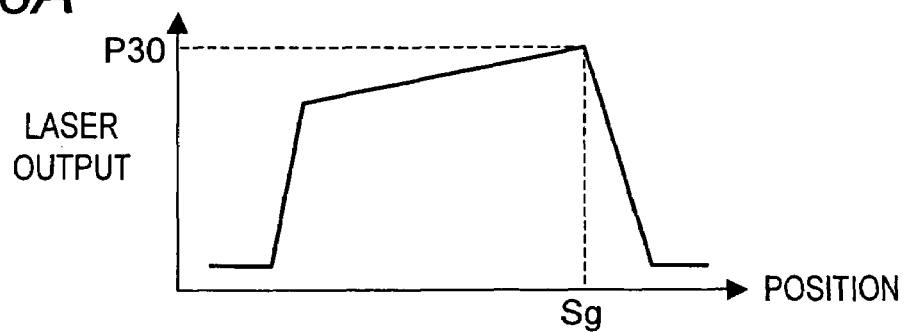
FIG. 8A is a waveform view showing a beam shape of a laser beam produced by a laser beam machine having a laser beam projection mask in the fourth embodiment of the present invention.

In the laser beam machine having the fourth embodiment, the beam shape of a second laser beam 19 emitted from a second laser light source 20 is different from that in the laser beam machine in the second embodiment described above. More particularly, in the laser beam machine having the fourth embodiment, the second laser beam 19 emitted from the second laser light source 20 has an asymmetric beam shape having a peak at a position Sq on the top side in forward direction in an irradiation region on the silicon film 4 as shown in FIG. 8A. The beam shape of the second laser beam 19 shown in FIG. 8A is flattered compared to the beam shape of the second laser beam 19 shown in FIG. 6A. It is to be noted that the beam shape of the first laser beam 18 is identical to that in the laser beam machine in the second embodiment.

Figure 8B:
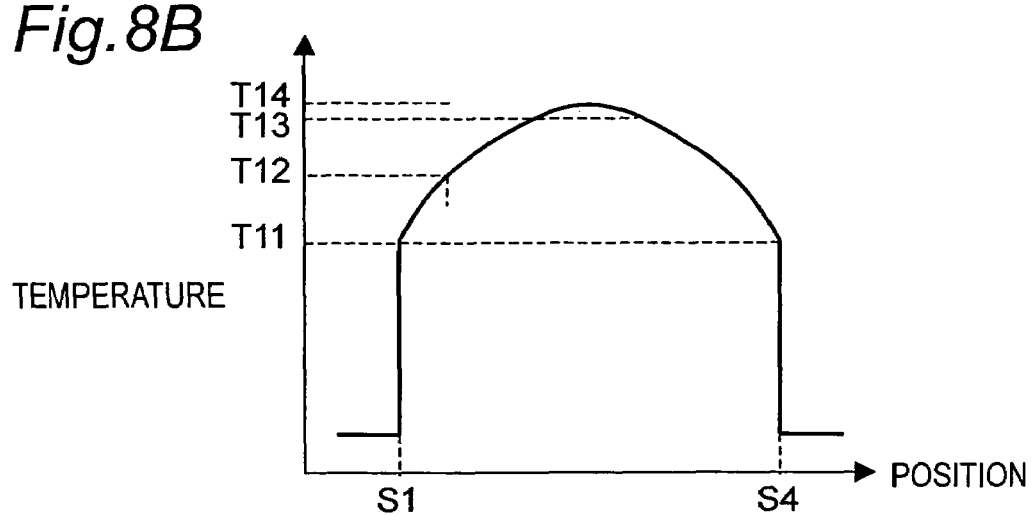
FIG. 8B is a temperature distribution view showing a temperature distribution formed in a silicon film as a result of irradiating the semiconductor device 1 with a laser beam by the laser beam machine.

With use of the first laser beam 18 and the second laser beam 19 in the beam shape shown in FIG. 8A, the surface of the silicon film 4 is irradiated with the first laser beam 18 and the second laser beam 19 transmitted through the projection mask 74 a plurality of times through the same step as in the laser beam machine in the second embodiment. As a result, a temperature distribution as shown in FIG. 8B is generated on the surface of the silicon film 4. In FIG. 8B, positions on the surface of the silicon film 4 are expressed as S1 and S4 in the order of the left-hand side to the right-hand side in AB direction shown in FIG. 1. From the position S1 to an almost central portion between the position S1 and the position S4 (corresponding to X direction in FIG. 9), the surface temperature of the silicon film 4 increases. Also from the almost central portion to the position S4, the surface temperature of the silicon film 4 decreases. Moreover, a temperature T11 at the position S1 and a temperature T11 at the position S4 are almost identical. It is to be noted that although the temperature distribution shown in FIG. 8B is flattered compared to the temperature distributions shown in FIG. 4B and FIG. 6B, the temperature in the central portion is high.

Figure 8C:
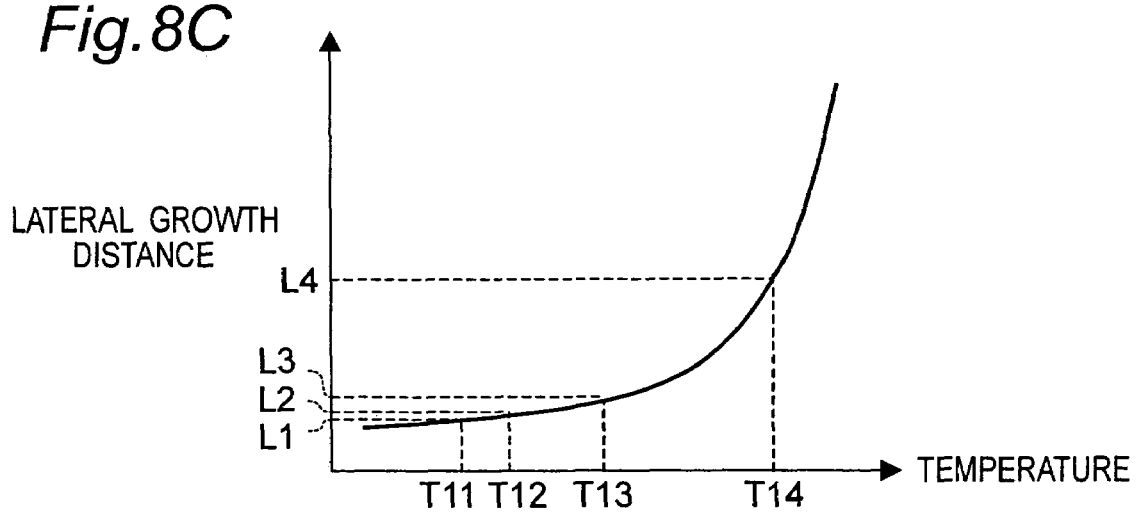
FIG. 8C is a characteristic view showing the change of a lateral growth distance in conformity with the temperature distribution of FIG. 8B.

Moreover, FIG. 8C shows the change in lateral growth distance in accordance with the temperature distribution T11 to T14 shown in FIG. 8B. Surface temperatures T11, T12, T13, T14 of the silicon film 4 respectively correspond to lateral growth distances L1, L2, L3, L4, and the more the temperature increases, the larger the lateral growth distance becomes.

In response to this, in the laser beam projection mask 57 of the fourth embodiment as aforementioned with reference to FIG. 9, transmission coefficients of the laser beam increase from both the end portions toward the central potion in X direction by the presence of the transmission areas constituted of the slits 75 to 78. More particularly, the sizes W21 to W24 of the respective slits 75 to 78 in Y direction correspond to a temperature curve shown in FIG. 8B.

Moreover, in the laser beam projection mask 74 of the fourth embodiment as shown in FIG. 9, the respective slits 76, 77, 78 are sequentially displaced from the slits 75, 76, 77 by the distances G22, G23, G24 in Y direction as described before. Thus, in the projection mask 74, the slits 76 to 78 are disposed in a stair-shaped pattern. The disposition of the slits 76 to 78 in the stair-shaped pattern makes it possible to increase the moving speed of the stage 16 and enhance the throughput.

According to the laser beam machines having the laser beam projection masks 14, 34, 54, 74 in the first to fourth embodiments, the crystallized region may be formed in the silicon film 4 through the aforementioned steps. By applying appropriate treatment to thus-formed semiconductor films, transistors can be formed and used as display elements for liquid-crystal panels and the like. In this case, according to the laser beam machining method by the laser beam machine having the laser beam projection mask of the present invention, the crystal grains formed on the semiconductor film are dramatically larger than those in the prior example, so that the mobility of carriers flowing in channels of the transistors is high, thereby making it possible to obtain elements with high performance.

Although description has been given of the case where amorphous material is an amorphous silicon film 4 in the first to fourth embodiments, without being limited thereto, the amorphous material layer may be made of amorphous germanium or germanium alloy.

Although the present invention has been described as above, it is apparent that the present invention may be modified in various ways. It should be understood that such modifications come within the spirit and the scope of the invention, and all the arrangements which will readily suggest themselves to those skilled in the art are intended to be embraced in the scope of the appended claims.

What is claimed is:

1. A laser beam projection mask comprising
a transmission area for transmitting a laser beam, wherein the transmission area is formed so that transmission coefficients of the laser beam are adjusted by dimensions of each transmission area and distributed in conformity with a temperature distribution of an irradiation subject, the temperature distribution being generated in a specified direction when an irradiation region on the irradiation subject irradiated with the transmitted laser beam moves relatively to the irradiation subject in the specified direction.

2. The laser beam projection mask as defined in claim 1, wherein
the transmission area is formed in a stair-shaped pattern toward the specified direction.

3. A laser beam projection mask comprising
a transmission area for transmitting a laser beam, wherein the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction,
wherein the transmission area is formed in a stair-shaped pattern toward the specified direction, and
wherein the transmission area expands toward the specified direction.

4. A laser beam projection mask comprising
a transmission area for transmitting a laser beam, wherein the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction,
wherein the transmission area is formed in a stair-shaped pattern toward the specified direction, and
wherein the transmission area shrinks toward the specified direction.

5. A laser beam projection mask comprising
a transmission area for transmitting a laser beam, wherein the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction, wherein the transmission area is formed in a stair-shaped pattern toward the specified direction, and wherein the transmission area expands from an end portion to a central portion in the specified direction.

6. A laser beam machining method, in which the laser beam projection mask is used that has a transmission area for transmitting a laser beam, wherein the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction and the laser beam is projected and irradiated on an amorphous material layer forming a substrate or an amorphous material layer formed on the substrate via the laser beam projection mask so as to crystallize the amorphous material layer, comprising:

a first crystallizing step for irradiating an inside of a first region formed on a surface of the amorphous material layer with the laser beam via the laser beam projection mask to melt the amorphous material layer in the first region and solidifying and crystallizing the melted amorphous material in the first region;

a region moving step for moving a region irradiated with the laser beam from the first region in the specified direction for a specified distance and determining a second region formed on a surface of the amorphous material layer so as to be partially superposed on the first region immediately before the movement; and a second crystallizing step for irradiating an inside of the second region with the laser beam via the laser beam projection mask to melt an amorphous material in the second region and solidifying and crystallizing the melted amorphous material in the second region, wherein until a region in which the amorphous material is crystallized reaches a specified size, irradiation of the surface of the amorphous material layer with the laser beam and movement of the region irradiated with the laser beam are repeated.

7. The laser beam machining method as defined in claim 6, wherein the laser beam irradiated onto the amorphous material via the laser beam projection mask is set as a first laser beam, and while the amorphous material is irradiated with the first laser beam, the amorphous material is irradiated with a second laser beam without via the laser beam projection mask.

8. The laser beam machining method as defined in claim 7, wherein in a spatial distribution of a temperature on the amorphous material layer forming a substrate or the amorphous material layer formed on the substrate, a temperature in a latter half region of the region irradiated with the laser beam with respect to a forward moving direction is set higher than a temperature in a former half thereof.

9. The laser beam machining method as defined in claim 7, wherein a spatial distribution of intensity of the second laser beam is a distribution in which a top portion with respect to the specified direction is high and a rear portion following the top portion is low, and a spatial distribution of a temperature on the amorphous material layer forming a substrate or the amorphous material layer formed on the substrate is such that a temperature in a latter half region of the region irradiated with the laser beam with respect to a forward moving direction is set lower than a temperature in a former half thereof.

10. The laser beam machining method as defined in claim 7, wherein the spatial distribution of the intensity of the second laser beam is set in such a way that in the spatial distribution of the temperature on the amorphous material layer forming a substrate or the amorphous material layer formed on the substrate, a temperature of a central portion is higher than a temperature in a peripheral portion of the central portion and a temperature distribution in the peripheral portion is almost uniform.

11. A laser beam machine, comprising: a laser light source; and the laser beam projection mask having a transmission area for transmitting a laser beam, wherein the transmission area is formed so that transmission coefficients of the laser beam are distributed in conformity with a temperature distribution of an irradiation subject, the temperature distribution being generated in a specified direction when an irradiation region on the irradiation subject irradiated with the transmitted laser beam moves relatively to the irradiation subject in the specified direction for projecting and irradiating the laser beam on a layer made of a amorphous material forming a substrate or a layer made of a amorphous material formed on the substrate via a laser beam projection mask so as to crystallize the amorphous material by executing:

a first crystallizing step for irradiating an inside of a first region formed on a surface of the layer made of the amorphous material with the laser beam via the laser beam projection mask to melt the amorphous material layer in the first region and solidifying and crystallizing the melted amorphous material in the first region;

a region moving step for moving a region irradiated with the laser beam from the first region in a specified direction for a specified distance and determining a second region formed on a surface of the layer made of the amorphous material layer so as to be partially superposed on the first region immediately before the movement; and a second crystallizing step for irradiating an inside of the second region with the laser beam via the laser beam projection mask to melt an amorphous material in the second region and solidifying and crystallizing the melted amorphous material in the second region, and further comprising a control portion for executing control so as to form a crystallized region made of the amorphous material into an asymmetric shape by repeating irradiation of the surface of the layer made of the amorphous material with the laser beam and movement of the region irradiated with the laser beam until the region in which the amorphous material is crystallized reaches a specified size.

* * * * *